(12) United States Patent
Tsubata

(10) Patent No.: US 8,367,284 B2
(45) Date of Patent: Feb. 5, 2013

(54) EXPOSURE DEVICE, EXPOSURE METHOD, AND METHOD FOR MANUFACTURING SEMICONDUCTOR DEVICE

(75) Inventor: Kyoichi Tsubata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 252 days.

(21) Appl. No.: 12/834,443

(22) Filed: Jul. 12, 2010

(65) Prior Publication Data

US 2011/0053060 A1    Mar. 3, 2011

(30) Foreign Application Priority Data

Aug. 25, 2009    (JP) .................................. 2009-194449

(51) Int. Cl.
*G03F 9/00*    (2006.01)
(52) U.S. Cl. .............................. 430/22; 430/30; 430/311
(58) Field of Classification Search ................... 430/22, 430/30, 311
See application file for complete search history.

(56) References Cited

U.S. PATENT DOCUMENTS 6,809,797 B2 * 10/2004 Baselmans et al. ............. 355/52
2005/0210438 A1    9/2005 Verstappen et al.

FOREIGN PATENT DOCUMENTS

JP    2005-33208 A    2/2005

* cited by examiner

*Primary Examiner* — Christopher Young
(74) *Attorney, Agent, or Firm* — Foley & Lardner LLP

(57) ABSTRACT

An exposure device includes a determining unit determines specific transfer patterns, which are transfer patterns of predetermined portions of a unit pattern, among transfer patterns projected through a photomask including an internal pattern having a plurality of unit patterns that is arranged at a predetermined interval and has the same shape, for two or more unit patterns, an error calculating unit calculates an error between the transfer pattern and the specified transfer pattern on the basis of the comparison between the relative position between the specific transfer patterns and a specified value of it, a correction parameter calculating unit calculates correction parameters for correcting the transfer patterns on the basis of the calculated error, and a correction control unit corrects exposure conditions using the correction parameters such that the transfer patterns are corrected.

3 Claims, 10 Drawing Sheets

X DIRECTION

Y DIRECTION

EXPOSURE DEVICE, EXPOSURE METHOD, AND METHOD FOR MANUFACTURING SEMICONDUCTOR DEVICE

This application is based on Japanese patent application No. 2009-194449, the content of which is incorporated hereinto by reference.

BACKGROUND

1. Technical Field

The present invention relates to an exposure device, an exposure method, and a method for manufacturing a semiconductor device.

2. Related Art

In a photolithography process, an exposure device is used to transfer the pattern of a photomask (for example, a reticle) to a photoresist on a substrate (for example, a semiconductor wafer). The transfer pattern (projection image) needs to be projected to a predetermined position on the substrate. However, in some cases, the transfer pattern is not transferred to a desired position due to, for example, the distortion of the photomask or the aberration of a lens.

Japanese Laid-Open Patent Publication No. 2005-33208 discloses a technique which measures the error of the transfer position of an internal pattern (a pattern transferred to a portion of a substrate in which a resist pattern is formed by exposure) of the photomask using the following method and removes the error by correction. That is, in the technique disclosed in Japanese Laid-Open Patent Publication No. 2005-33208, first, the pattern data of the photomask is acquired before exposure. Then, an optical image on the surface of the wafer when exposure light is emitted to the photomask is calculated by a simulation using the acquired pattern data (hereinafter, the optical image calculated by the simulation is referred to as a simulation image). Then, the simulated pattern is actually transferred onto a wafer stage with exposure light, and the projection image of the transfer pattern is measured by a sensor that is provided on the wafer stage. Then, the difference between the measured projection image (measured image) and the simulation image is calculated, thereby measuring the position error of the internal pattern of the photomask. Then, the transfer position is corrected such that the measured position error is removed. Then, actual exposure is performed.

SUMMARY

The present inventor has recognized as follows. The simulation result of the photomask pattern is not necessarily identical to the exact projection image (the projection image when the relative position between the photomask and the substrate and the magnification of the exposure lens are correct) due to the accuracy of the simulation or the manufacturing accuracy of the photomask. Therefore, in the technique disclosed in Japanese Laid-Open Patent Publication No. 2005-33208, the correction accuracy of the transfer position is not sufficiently high. In addition, the technique disclosed in Japanese Laid-Open Patent Publication No. 2005-33208 that performs the simulation requires a lot of time and effort, which results in an increase in manufacturing costs. In general, it takes a lot of time and effect to acquire the data of the internal pattern of the photomask as a process of preparing for the simulation.

As such, it is difficult to correct the transfer pattern during exposure with sufficient accuracy using a simple method.

In one embodiment, there is provided an exposure device including a light intensity distribution detecting unit that detects an intensity distribution of light projected through a photomask including an internal pattern which is projected to a portion of a substrate to be exposed in which a resist pattern is formed by exposure and the internal pattern includes a plurality of unit patterns that is arranged at a predetermined interval and has a same shape, a specific transfer pattern determining unit that determines specific transfer patterns, which are transfer patterns of predetermined portions of the unit pattern, among transfer patterns projected through the photomask, the specific transfer pattern determining unit determines the specific transfer patterns for two or more unit patterns on the basis of a detection result of the light intensity distribution detecting unit, an error calculating unit that calculates an error between the transfer pattern and a specified transfer pattern on the basis of a comparison between a relative position between the specific transfer patterns determined by the specific transfer pattern determining unit and a specified value of the relative position, a correction parameter calculating unit that calculates correction parameters for correcting the transfer patterns on the basis of the error calculated by the error calculating unit, and a correction control unit that corrects exposure conditions using the correction parameters such that the transfer patterns are corrected.

According to the exposure device, the specific transfer patterns, which are the transfer patterns of predetermined portions of the unit pattern, among the transfer patterns projected through the photomask are determined for two or more unit patterns on the basis of the detection result of the light intensity distribution detecting unit. The error between the transfer pattern and the specified transfer pattern is calculated on the basis of the comparison between the relative position between the determined specific transfer patterns and the specified value of the relative position. The correction parameters for correcting the transfer patterns are calculated on the basis of the calculated error. The exposure conditions are corrected using the correction parameters such that the transfer patterns are corrected. That is, the exposure conditions are corrected on the basis of the error of the transfer pattern of the unit pattern included in the internal pattern. Therefore, it is possible to correct the transfer pattern with high accuracy, as compared to when the transfer pattern is corrected only by using the alignment marks. In addition, information of the approximate positions of the specific transfer patterns and information of the specified value of the relative position between the specific transfer patterns may be given to the exposure device in advance. Therefore, it is possible to correct the transfer pattern easier than the technique that performs the simulation. In addition, in some cases, the accuracy of correction deteriorates due to the accuracy of simulation. Therefore, it is possible to correct the transfer pattern with high accuracy, as compared to the technique that performs the simulation. In short, it is possible to correct the transfer pattern during exposure with sufficient accuracy using a simple method.

In another embodiment, there is a provided a method for manufacturing a semiconductor device, including detecting an intensity distribution of light projected through a photomask including an internal pattern which is projected to a portion of a semiconductor wafer to be exposed in which a resist pattern is formed by exposure and said internal pattern includes a plurality of unit patterns that is arranged at a predetermined interval and has a same shape, determining specific transfer patterns, which are transfer patterns of predetermined portions of the unit pattern, among transfer patterns that are projected through the photomask for two or more unit patterns on the basis of a detection result in the detecting of the intensity distribution of light, calculating an error between the transfer pattern and a specified transfer pattern on the basis of a comparison between a relative position between the specific transfer patterns determined in the determining of the specific transfer patterns and a specified value of the relative position, calculating correction parameters for correcting the transfer patterns on the basis of the error calculated in the calculating of the error, correcting exposure conditions using the correction parameters such that the transfer patterns are corrected, and exposing the semiconductor wafer through the photomask.

In still another embodiment, there is provided an exposure method including detecting an intensity distribution of light projected through a photomask including an internal pattern which is projected to a portion of a substrate to be exposed in which a resist pattern is formed by exposure and the internal pattern includes a plurality of unit patterns that is arranged at a predetermined interval and has a same shape, determining specific transfer patterns, which are transfer patterns of predetermined portions of the unit pattern, among transfer patterns that are projected through the photomask for two or more unit patterns on the basis of a detection result in the detecting of the intensity distribution of light, calculating an error between the transfer pattern and a specified transfer pattern on the basis of a comparison between a relative position between the specific transfer patterns determined in the determining of the specific transfer patterns and a specified value of the relative position, calculating correction parameters for correcting the transfer patterns on the basis of the error calculated in the calculating of the error, correcting exposure conditions using the correction parameters such that the transfer patterns are corrected, and exposing the substrate through the photomask.

According to the above-mentioned embodiments of the invention, it is possible to correct the transfer pattern during exposure with sufficient accuracy using a simple method.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Before describing of the present invention, the related art will be explained in detail in order to facilitate the understanding of the present invention.

As a technique for correcting the position error of a transfer pattern, there is a technique which feeds back a position error measured after exposure to the subsequent lot process and transfers the transfer pattern to a desired position in the subsequent lot process. According to this technique, since there is a small variation in an error cause, such as the distortion of a photomask or the aberration of a lens, it is possible to obtain the effect of preventing the position error. However, in this technique, when there is no lot process history, it is difficult to correct the position error. In addition, when there is a variation in the position of components of an exposure device, it is difficult to appropriately correct the position error.

Figure 3:
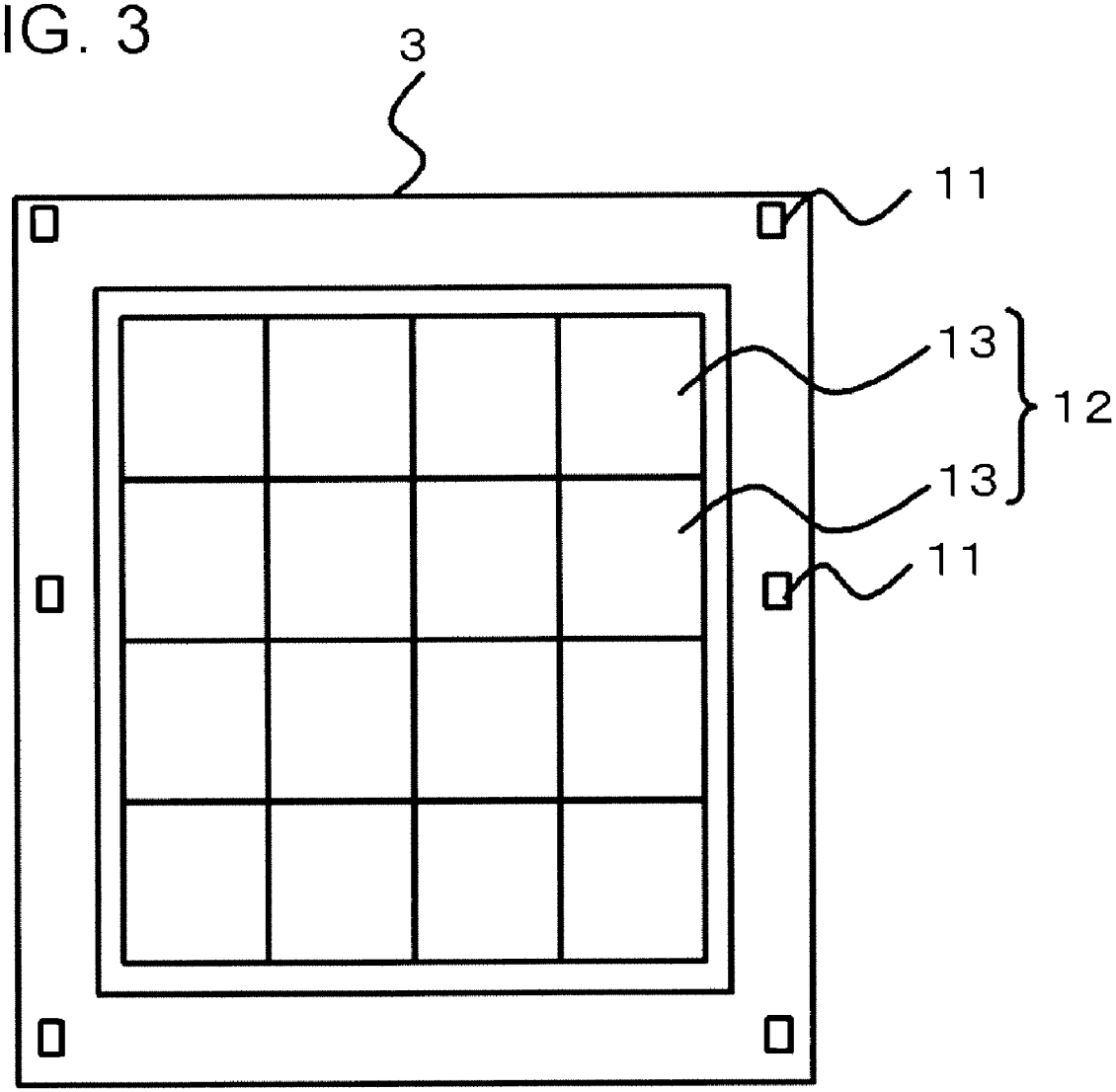
FIG. 3 is a plan view schematically illustrating a reticle.

As a technique for solving the above-mentioned problems, there is the following technique: as shown in FIG. 3, alignment marks 11, which are patterns only for alignment, are formed on a reticle 3; the positions of the alignment marks 11 transferred by exposure light are measured; an error is calculated from the specified value of the measured transfer position; the transfer pattern is corrected such that the error is removed; and actual exposure is performed. The transfer pattern may be corrected by appropriately correcting the relative position between the reticle 3 and a substrate and correcting the magnification of an exposure lens.

However, the alignment mark 11 has, for example, a size of several millimeters on the reticle 3. When the alignment marks 11 are formed at a position close to the center of the reticle 3, the effective area (the area that is effective as a product) of the wafer is reduced. Therefore, in general, as shown in FIG. 3, the alignment marks 11 are formed at the edge of the reticle 3. The technique that corrects the transfer pattern using the alignment marks 11 can obtain only the positional information of the edge of the reticle 3, that is, a region close to the outermost portion of an exposure range in one exposure shot. Therefore, only positional information that is not related to the positional information of an internal pattern 12 of the reticle 3 is obtained, and the position error is not accurately corrected due to the non-related positional information.

Figure 10A:
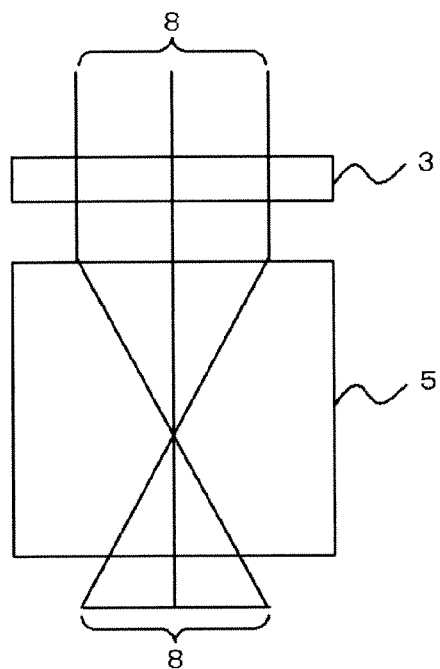
FIGS. 10A and 10B are diagrams illustrating aspects in which exposure light passes through the reticle and an exposure lens.
Figure 10B:
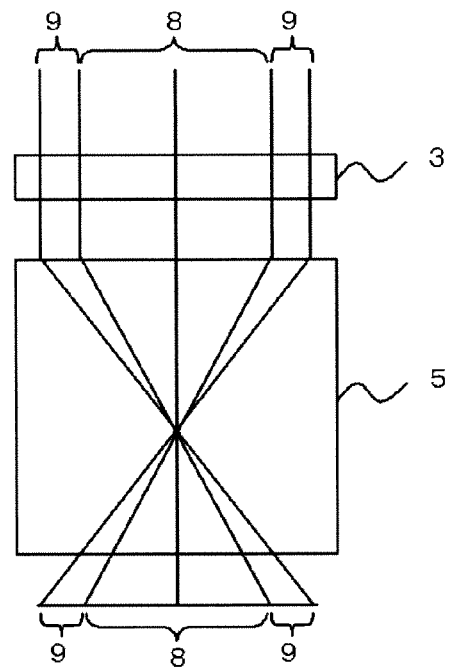

Next, this point will be described in detail. FIGS. 10A and 10B are diagrams illustrating aspects in which exposure light passes through the reticle 3 and an exposure lens 5. FIG. 10A shows only an effective portion 8 of the exposure light that is used to transfer the internal pattern 12 (FIG. 3) of the reticle 3, and FIG. 10B shows a non-effective portion 9, which is a peripheral portion of the exposure light that is not used to transfer the internal pattern 12 of the reticle 3 in addition to the effective portion 8. Among the portions, light in the non-effective portion 9 is used to transfer the alignment marks 11. As shown in FIG. 10B, light in the non-effective portion 9 passes through the edge of the reticle 3 and then passes through a circumferential portion of the exposure lens 5. However, in general, the accuracy of the circumferential portion of the exposure lens 5 is not guaranteed. That is, since light passing through the edge of the reticle 3 passes through a portion of the exposure lens 5 whose accuracy is not guaranteed, the light is likely to be affected by the unexpected distortion of the lens. Therefore, an error that is not related to the transfer position of the internal pattern 12 of the reticle 3 is likely to be included in the transfer position of the alignment mark 11. That is, in the technique that corrects the transfer pattern using the alignment marks 11, the transfer pattern is likely to be inaccurately corrected due to positional information that is not related to the positional information of the internal pattern 12. As a result, in some cases, it is difficult to correct the transfer pattern with sufficiently high accuracy.

The technique disclosed in Japanese Laid-Open Patent Publication No. 2005-33208 simulates the internal pattern of the photomask. Therefore, the technique disclosed in Japanese Laid-Open Patent Publication No. 2005-33208 can correct the transfer position with higher accuracy than the above-mentioned technique which corrects the transfer pattern using the alignment marks 11. However, as described above, in the technique disclosed in Japanese Laid-Open Patent Publication No. 2005-33208, the correction accuracy of the transfer position is not sufficiently high. In addition, as described above, the technique disclosed in Japanese Laid-Open Patent Publication No. 2005-33208 requires a lot of time and effort, which results in an increase in manufacturing costs.

As such, it is difficult to correct the transfer pattern during exposure with high accuracy using a simple method.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

Figure 1:
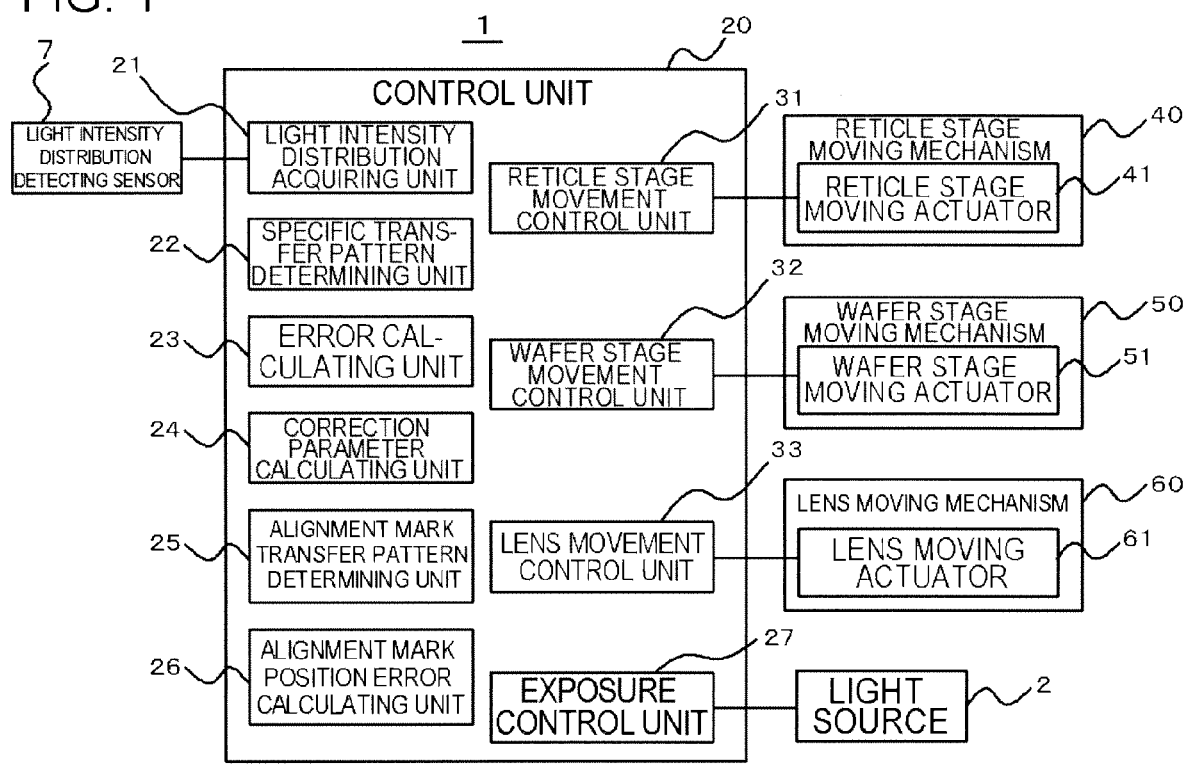
FIG. 1 is a block diagram illustrating the structure of an exposure device according to an embodiment of the invention.
Figure 2:
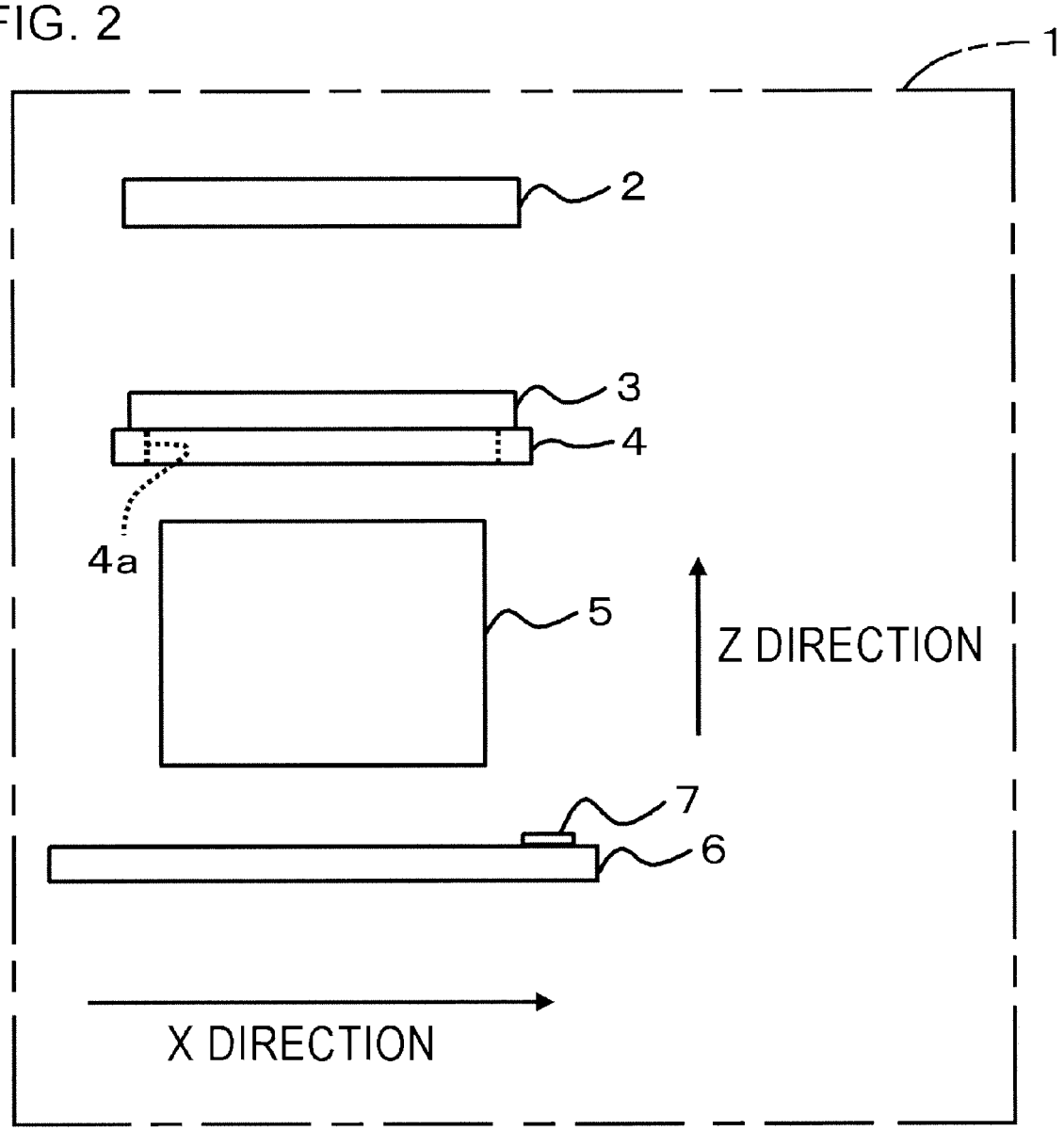
FIG. 2 is a front view schematically illustrating the structure of the exposure device according to the embodiment.
Figure 4:
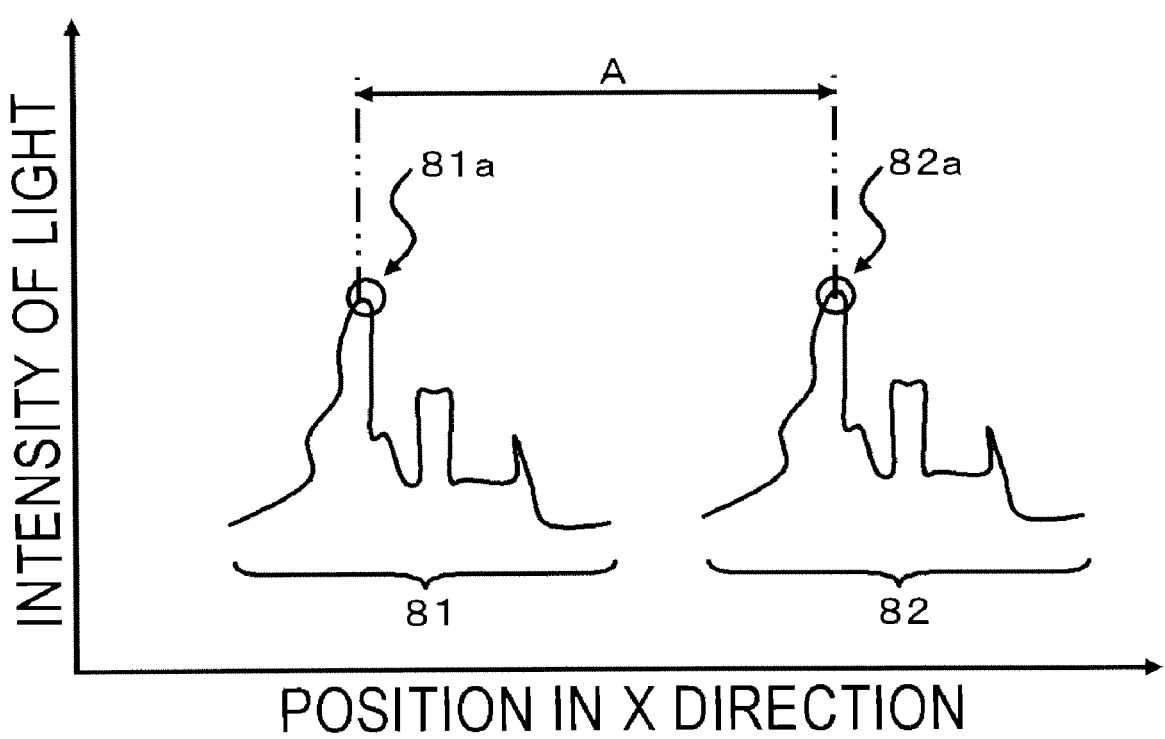
FIG. 4 is a diagram schematically illustrating an example of the detection results of light intensity distributions of transfer patterns of two unit patterns of the reticle.
Figure 5:
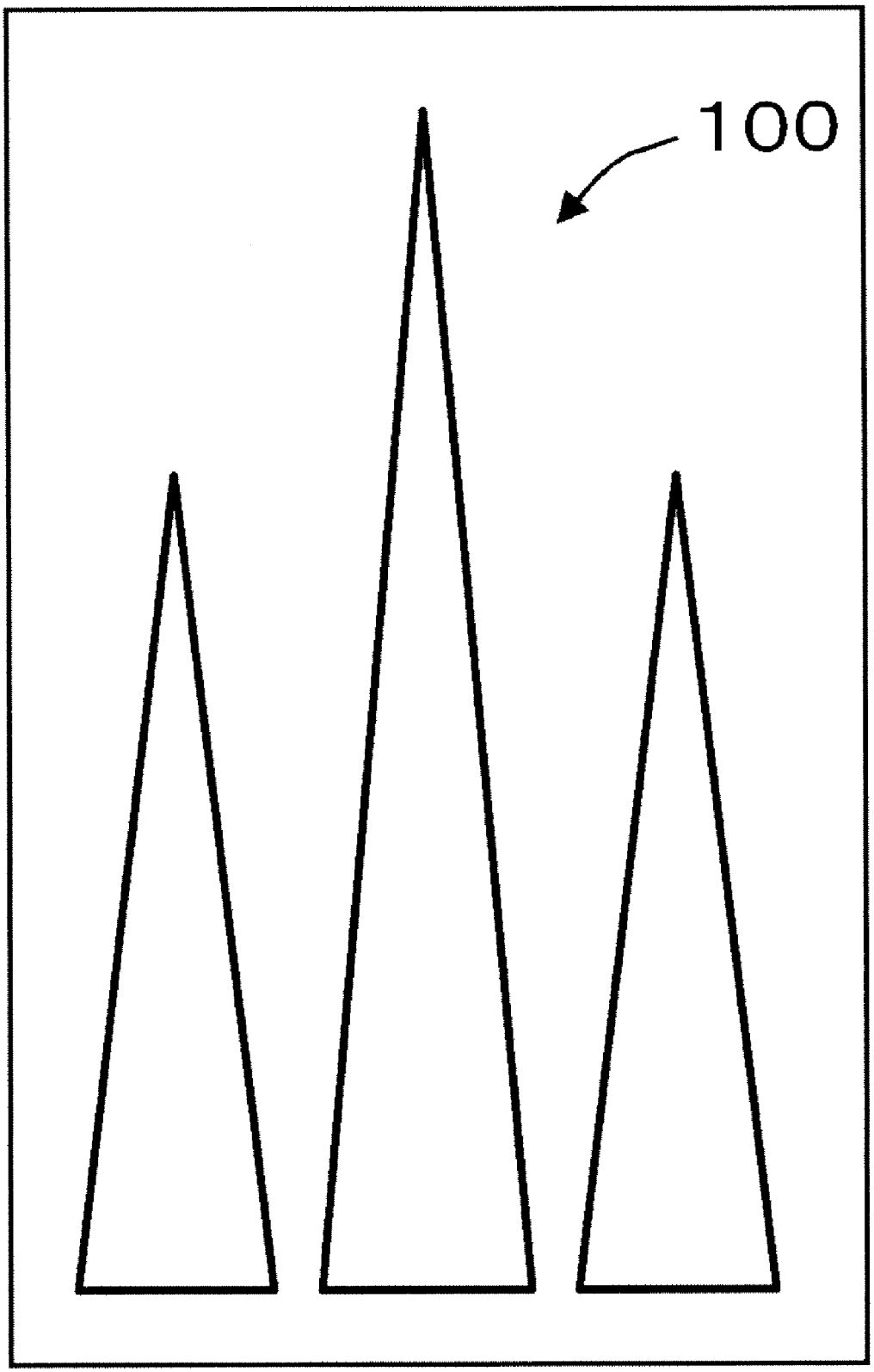
FIG. 5 is a diagram schematically illustrating an example of an alignment mark transfer pattern.
Figure 6A:
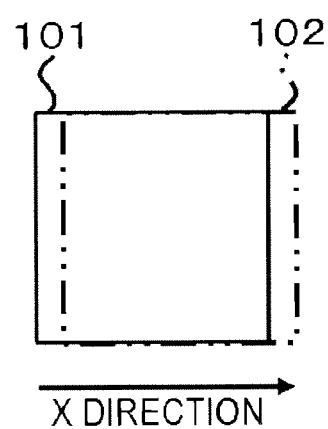
FIGS. 6A and 6B are diagrams illustrating the position error of the transfer pattern.
Figure 6B:
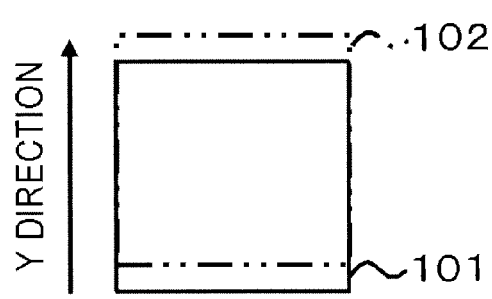
Figure 7A:
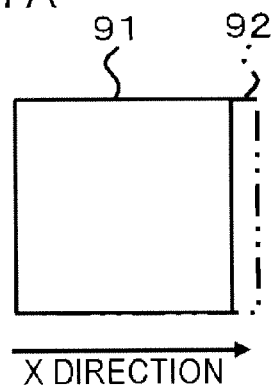
FIGS. 7A to 7D are diagrams illustrating the magnification error of the transfer pattern.
Figure 7B:
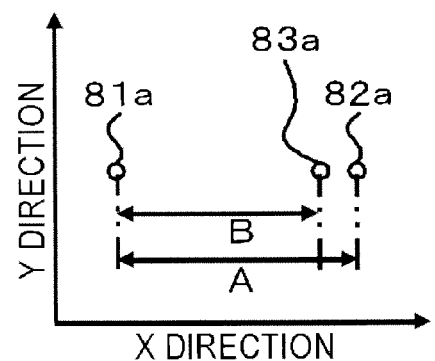
Figure 7C:
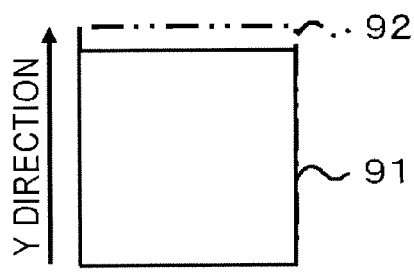
Figure 7D:
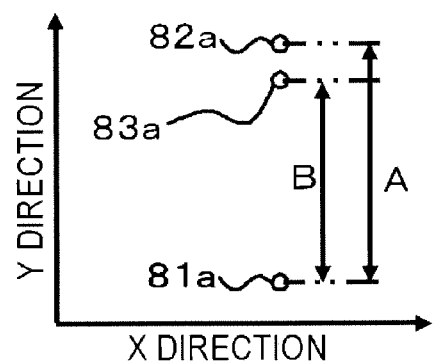
Figure 8A:
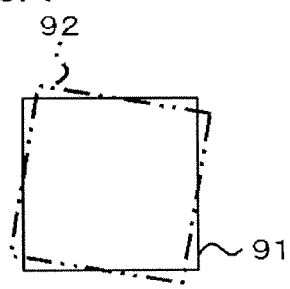
FIGS. 8A and 8B are diagrams illustrating the rotation error of the transfer pattern.
Figure 8B:
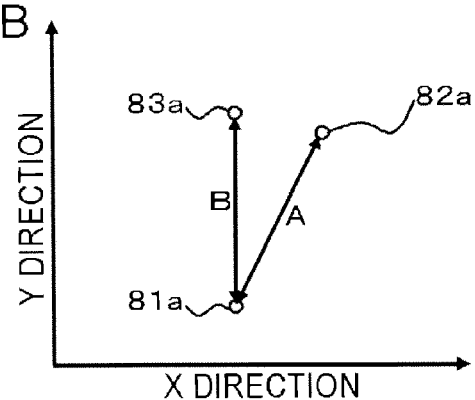
Figure 8C:
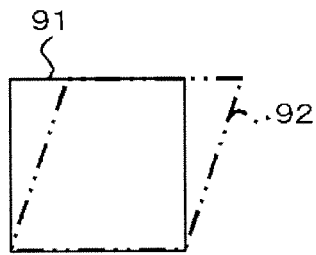
FIGS. 8C and 8D are diagrams illustrating the orthogonality error of the transfer pattern.
Figure 8D:
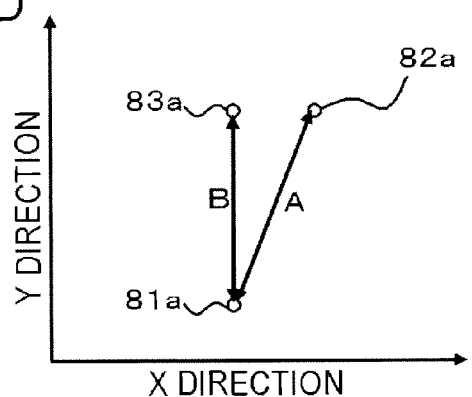
Figure 9:
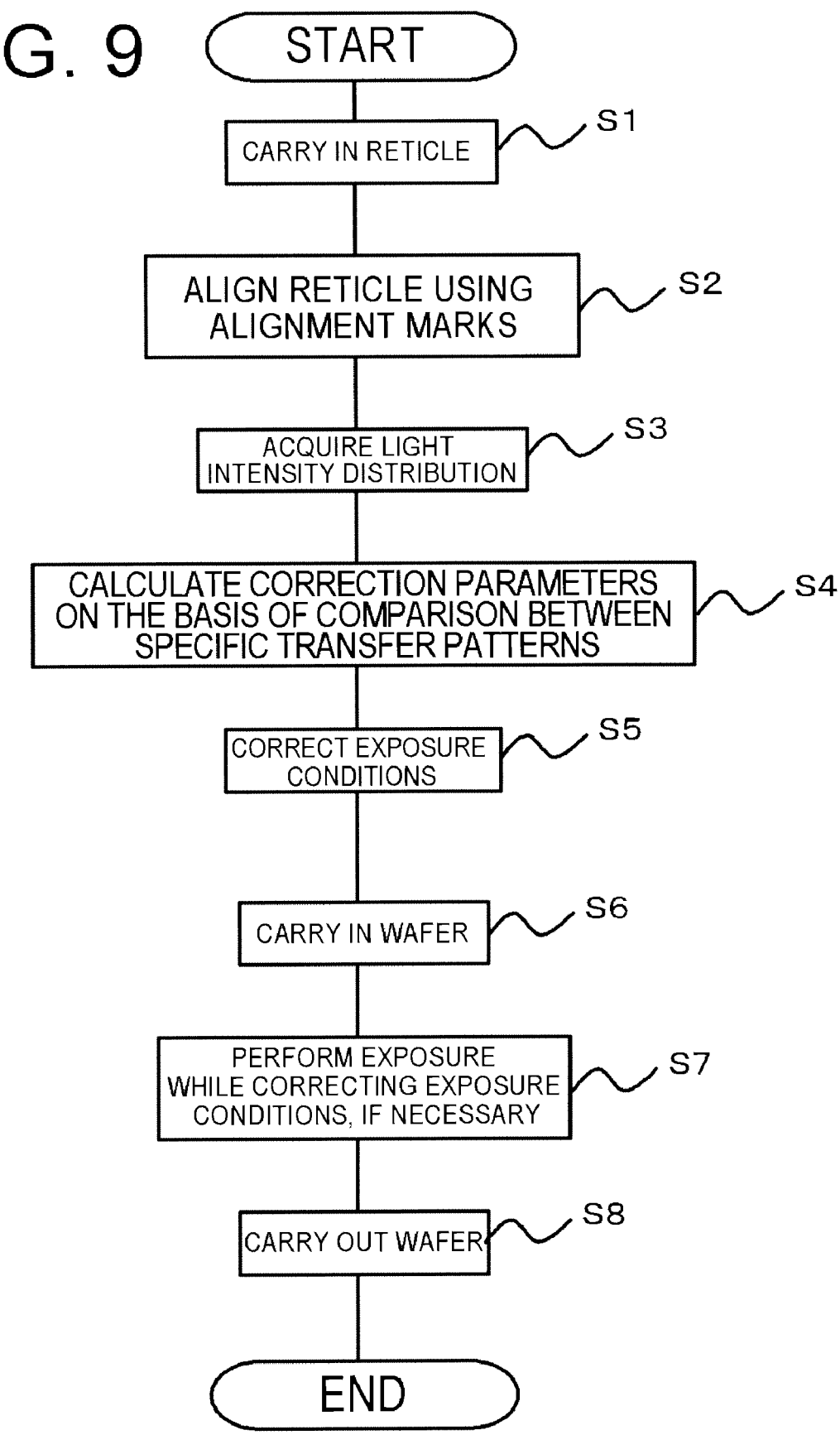
FIG. 9 is a flowchart illustrating a method for manufacturing a semiconductor device according to the embodiment.

FIG. 1 is a block diagram illustrating the structure of an exposure device 1 according to an embodiment. FIG. 2 is a front view schematically illustrating the structure of the exposure device 1 according to the embodiment. FIG. 3 is a plan view schematically illustrating the reticle 3. FIG. 4 is a diagram schematically illustrating an example of the detection results of light intensity distributions 81 and 82 of transfer patterns of two unit patterns 13 of the reticle 3. FIG. 5 is a diagram schematically illustrating an example of the transfer pattern of the alignment mark 11 (alignment mark transfer pattern 100). FIGS. 6A and 6B are diagrams illustrating the position error of the transfer pattern. Specifically, FIG. 6A shows the position error in the X direction, and FIG. 6B shows the position error in the Y direction. FIGS. 7A to 7D are diagrams illustrating the magnification error of the transfer pattern. Specifically, FIGS. 7A and 7B show the magnification error in the X direction, and FIGS. 7C and 7D show the magnification error in the Y direction. FIGS. 8A and 8B are diagrams illustrating the rotation error of the transfer pattern. FIGS. 8C and 8D are diagrams illustrating the orthogonality error of the transfer pattern. FIG. 9 is a flowchart illustrating a method for manufacturing a semiconductor device according to the embodiment.

The exposure device 1 according to the embodiment includes: a light intensity distribution detecting unit (for example, a light intensity distribution detecting sensor 7) that detects an intensity distribution of light projected through a photomask (for example, the reticle 3) including an internal pattern 12 which is projected to a portion of a substrate (for example, a semiconductor wafer) to be exposed in which a resist pattern is formed by exposure and the internal pattern includes a plurality of unit patterns 13 that is arranged at a predetermined interval and has a same shape; a specific transfer pattern determining unit 22 that determines specific transfer patterns 81a and 82a, which are transfer patterns of predetermined portions of the unit pattern 13, among transfer patterns that are projected through the photomask, the specific transfer pattern determining unit 22 determines the specific transfer patterns 81a and 82a for two or more unit patterns 13 on the basis of the detection result of the light intensity distribution detecting unit; an error calculating unit 23 that calculates an error between the transfer pattern and a specified transfer pattern on the basis of a comparison between a relative position A between the specific transfer patterns 81a and 82a determined by the specific transfer pattern determining unit 22 and a specified value B of the relative position; a correction parameter calculating unit 24 that calculates correction parameters for correcting the transfer patterns on the basis of the error calculated by the error calculating unit 23; and a correction control unit (exposure control unit 27) that corrects exposure conditions using the correction parameters such that the transfer patterns are corrected.

A method for manufacturing a semiconductor device according to the embodiment includes: detecting an intensity distribution of light projected through a photomask (for example, the reticle 3) including an internal pattern 12 which is projected to a portion of a semiconductor wafer to be exposed in which a resist pattern is formed by exposure and said internal pattern includes a plurality of unit patterns 13 that is arranged at a predetermined interval and has a same shape; determining specific transfer patterns 81a and 82a, which are transfer patterns of predetermined portions of the unit pattern 13, among the transfer patterns that are projected through the photomask for two or more unit patterns 13 on the basis of a detection result in the detecting of the intensity distribution of light; calculating an error between the transfer pattern and a specified transfer pattern on the basis of a comparison between a relative position A between the specific transfer patterns 81a and 82a determined in the determining of the specific transfer patterns and a specified value B of the relative position; calculating correction parameters for correcting the transfer patterns on the basis of the error calculated in the calculating of the error; correcting exposure conditions using the correction parameters such that the transfer patterns are corrected; and exposing the semiconductor device through the photomask.

An exposure method according to the embodiment includes: detecting an intensity distribution of light projected through a photomask (for example, the reticle 3) including an internal pattern 12 which is projected to a portion of a substrate (semiconductor wafer) to be exposed in which a resist pattern is formed by exposure and the internal pattern includes a plurality of unit patterns that is arranged at a predetermined interval and has a same shape; determining specific transfer patterns 81a and 82a, which are transfer patterns of predetermined portions of the unit pattern 13, among transfer patterns that are projected through the photomask for two or more unit patterns 13 on the basis of a detection result in the detecting of the intensity distribution of light; calculating an error between the transfer pattern and a specified transfer pattern on the basis of a comparison between a relative position A between the specific transfer patterns 81a and 82a determined in the determining of the specific transfer patterns and a specified value B of the relative position; calculating correction parameters for correcting the transfer patterns on the basis of the error calculated in the calculating of the error; correcting exposure conditions using the correction parameters such that the transfer patterns are corrected; and exposing the semiconductor device through the photomask.

The above is described in detail as follows;
First, the structure of the exposure device 1 is described.

As shown in FIG. 2, the exposure device 1 according to the embodiment includes a light source 2 that emits exposure light, a reticle stage 4 on which the reticle 3 is placed, the exposure lens 5, a wafer stage 6 on which a semiconductor wafer (hereinafter, simply referred to as a wafer) (not shown) is placed, and the light intensity distribution detecting sensor 7.

As shown in FIG. 3, a plurality of alignment marks 11 is formed at the edge of the reticle 3, and the internal pattern 12 is formed in a portion of the reticle 3 that is closer to the center than the edge. The internal pattern 12 is projected to a portion of the wafer to be exposed in which the resist pattern is formed by exposure. A portion of the wafer to which the internal pattern 12 is transferred forms product circuits. The alignment marks 11 are projected to a portion of the wafer that is outside the portion in which the resist pattern is formed by exposure. The internal pattern 12 includes a plurality of unit patterns 13 that is arranged at a predetermined interval and has the same shape. It is preferable that the predetermined interval be, for example, a constant interval. However, the predetermined interval may not be the constant interval. For example, the unit patterns 13 are patterns (sub-chip) that are transferred to a portion of the wafer that will be each chip. In the example shown in FIG. 3, the internal pattern 12 includes a total of sixteen unit patterns 13 arranged in four rows and four columns. Therefore, in the example shown in FIG. 3, the sixteen unit patterns 13 are transferred to the resist on the wafer by one exposure shot, and it is possible to transfer the unit patterns 13 to a desired region of the wafer by repeating a necessary number of exposure shots while changing the position of the wafer. In addition, in the example shown in FIG. 3, a total of six alignment marks 11 are formed on the reticle 3.

An opening 4a is formed in the reticle stage 4. The reticle 3 is placed on a frame-shaped portion around the opening 4a in the reticle stage 4. The reticle 3 is placed on the reticle stage 4 such that the internal pattern 12 and the alignment marks 11 are disposed in the opening 4a.

The exposure light emitted from the light source 2 passes through the reticle 3 placed on the reticle stage 4 and is then incident on the exposure lens 5 through the opening 4a of the reticle stage 4. Then, the light passes through the exposure lens 5 and is then incident on the wafer stage 6.

The light intensity distribution detecting sensor 7 includes, for example, a plurality of pixels (not shown) arranged in a matrix, and each pixel detects the intensity of light at multiple gray levels (for example, 16 shades of gray). In this way, the light intensity distribution detecting sensor 7 detects the total intensity distribution of light projected through the reticle 3. The light intensity distribution detecting sensor 7 outputs the detection result to a control unit 20 (which will be described below).

As shown in FIG. 1, the exposure device 1 further includes the control unit 20, a reticle stage moving mechanism 40, a wafer stage moving mechanism 50, and a lens moving mechanism 60.

During actual exposure, exposure light is emitted to the reticle 3 through a slit, and the light passing through the reticle 3 is incident on the wafer. In the case of the latest scan-type exposure device, the reticle stage 4 and the wafer stage 6 are moved in the opposite direction (in FIG. 2, for example, the reticle stage 4 is moved in the X direction and the wafer stage 6 is moved in the −X direction) to control the position on the wafer where the pattern is formed.

The reticle stage moving mechanism 40 includes a linear moving mechanism, such as a ball screw transport mechanism, and a rotating mechanism. The reticle stage moving mechanism 40 further includes a reticle stage moving actuator 41 having, for example, a motor for driving the linear moving mechanism and a motor for driving the rotating mechanism. The reticle stage moving actuator 41 can drive the linear moving mechanism to move the reticle stage 4 in the X direction (FIG. 2) and the Y direction (for example, a depth direction with respect to the plane of FIG. 2). In addition, the reticle stage moving actuator 41 can drive the rotating mechanism to rotate the reticle stage 4 in the X-Y plane.

The wafer stage moving mechanism 50 includes a linear moving mechanism, such as a ball screw transport mechanism, and a wafer stage moving actuator 51, such as a motor for driving the linear moving mechanism. The wafer stage moving actuator 51 can drive the linear moving mechanism to move the wafer stage 6 in the X direction and the Y direction. It is possible to move the wafer stage 6 with sufficient accuracy while measuring the position of the wafer stage 6 with a measuring instrument used in a general exposure operation, such as an interferometer.

The exposure lens 5 includes, for example, a plurality of lens groups. The lens moving mechanism 60 moves the positions of one or more predetermined lenses (hereinafter, referred to as moving lenses) in the plurality of lens groups in the optical axis direction (FIG. 2, in the Z direction) of the exposure light to change the magnification of the exposure lens 5. The lens moving mechanism 60 includes a moving mechanism, such as a ball screw transport mechanism, and a lens moving actuator 61, such as a motor for driving the moving mechanism. The lens moving actuator 61 can drive the moving mechanism to move the moving lenses in the Z direction.

The control unit 20 includes a light intensity distribution acquiring unit 21, a specific transfer pattern determining unit 22, an error calculating unit 23, a correction parameter calculating unit 24, an alignment mark transfer pattern determining unit 25, an alignment mark position error calculating unit 26, an exposure control unit 27, a reticle stage movement control unit 31, a wafer stage movement control unit 32, and a lens movement control unit 33.

The reticle stage movement control unit 31 controls the operation of the reticle stage moving actuator 41 to control the position of the reticle stage 4 in the X direction and the Y direction and the rotation of the reticle stage 4 in the X-Y plane. The wafer stage movement control unit 32 controls the operation of the wafer stage moving actuator 51 to control the position of the wafer stage 6 in the X direction and the Y direction. The lens movement control unit 33 controls the operation of the lens moving actuator 61 to control the position of the moving lenses in the Z direction and the magnification of the exposure lens 5.

For example, the light source 2 is a pulsed laser, such as a KrF laser or an ArF laser. Since the light source 2 is turned on and off in kHz order for one second, it emits substantially continuous light.

The exposure control unit 27 controls the time from the start of a series of emission (turning-on and off) operations of the light source 2 to the end of the emission operations in each exposure shot, that is, the timing of the exposure shot, and controls the relative position between the wafer stage 6 and the reticle stage 4 during the exposure shot. For example, the exposure control unit 27 controls the position of the wafer stage 6 to control the relative position between the wafer stage 6 and the reticle stage 4 during each exposure shot.

The light intensity distribution acquiring unit 21 acquires the detection result of the light intensity distributions (for example, the light intensity distributions 81 and 82 shown in FIG. 4) that are detected by the light intensity distribution detecting sensor 7 and are then input from the light intensity distribution detecting sensor 7 to the control unit 20. When acquiring the detection result, the light intensity distribution acquiring unit 21 controls the wafer stage movement control unit 32 to control the movement of the wafer stage 6 and controls the exposure control unit 27 to control the emission of the light source 2.

The specific transfer pattern determining unit 22 determines specific transfer patterns, which are transfer patterns of predetermined portions of the unit pattern 13, among the transfer patterns that are projected through the reticle 3 for two or more unit patterns 13 on the basis of the detection result (that is, the light intensity distributions 81 and 82) of the light intensity distribution detecting sensor 7. For example, as shown in FIG. 4, the specific transfer pattern determining unit 22 determines the specific transfer patterns 81a and 82a for two unit patterns 13.

The error calculating unit 23 calculates an error between an actual transfer pattern and a specified transfer pattern on the basis of the comparison between the relative position A (FIGS. 4, 7B, 7D, 8B and 8D) between the specific transfer patterns 81a and 82a determined by the specific transfer pattern determining unit 22 and the specified value B (FIGS. 7B, 7D, 8B and 8D) of the relative position.

Examples of the error of the transfer pattern include a total of six error components, that is, a position error in the X direction, a position error in the Y direction, a magnification error in the X direction, a magnification error in the Y direction, a rotation error, and an orthogonality error. The error calculating unit 23 calculates a total of four error components, that is, the magnification error in the X direction, the magnification error in the Y direction, the rotation error, and the orthogonality error, among the six error components. The four error components calculated by the error calculating unit 23 is described with reference to FIGS. 7A to 7D and FIGS. 8A to 8D as follows; for simplicity of description, it is assumed that the transfer pattern is a simple rectangle.

First, the magnification error in the X direction is described with reference to FIGS. 7A and 7B; for example, it is assumed that, when the original (specified) transfer pattern is a transfer pattern 91 shown in FIG. 7A, a transfer pattern 92 is actually transferred by exposure. In this case, the actual transfer pattern 92 is extended (enlarged) from the specified transfer pattern 91 in the right direction (X direction) of FIG. 7A. In this case, as shown in FIG. 7B, for example, when the specific transfer pattern 81a is used as a reference point, the position of the specific transfer pattern 82a deviates from the specified position 83a of the specific transfer pattern 82a in the X direction. In other words, the relative position A between the specific transfer pattern 81a and the specific transfer pattern 82a is extended from the relative position B between the specific transfer pattern 81a and the position 83a in the X direction. When the specific transfer pattern determining unit 22 determines the specific transfer patterns 81a and 82a shown in FIG. 7B, the error calculating unit 23 recognizes that there is a magnification error in the X direction from the positional deviation in the X direction, and calculates the amount of error, thereby calculating the error between the actual transfer pattern 92 and the specified transfer pattern 91.

Next, the magnification error in the Y direction is described with reference to FIGS. 7C and 7D; for example, it is assumed that, when the original (specified) transfer pattern is a transfer pattern 91 shown in FIG. 7C, a transfer pattern 92 is actually transferred by exposure. In this case, the actual transfer pattern 92 is extended (enlarged) from the specified transfer pattern 91 in the upward direction (Y direction) of FIG. 7C. In this case, as shown in FIG. 7D, for example, when the specific transfer pattern 81a is used as the reference point, the position of the specific transfer pattern 82a deviates from the specified position 83a of the specific transfer pattern 82a in the Y direction. In other words, the relative position A between the specific transfer pattern 81a and the specific transfer pattern 82a is extended from the relative position B between the specific transfer pattern 81a and the position 83a in the Y direction. When the specific transfer pattern determining unit 22 determines the specific transfer patterns 81a and 82a shown in FIG. 7C, the error calculating unit 23 recognizes that there is a magnification error in the Y direction from the positional deviation in the Y direction, and calculates the amount of error, thereby calculating the error between the actual transfer pattern 92 and the specified transfer pattern 91.

In some cases, the actual transfer pattern 92 is not enlarged, but is reduced by exposure, as compared to the specified transfer pattern 91. In such case, the error calculating unit 23 can recognize that there is a magnification error in the X direction or the Y direction from the positional deviation in the X direction or the Y direction and calculate the amount of error.

Next, the rotation error is described with reference to FIGS. 8A and 8B; for example, it is assumed that, when the original (specified) transfer pattern is a transfer pattern 91 shown in FIG. 8A, a transfer pattern 92 is actually transferred by exposure. In this case, the actual transfer pattern 92 is rotated from the specified transfer pattern 91 in the clockwise direction. In this case, as shown in FIG. 8B, for example, the position of the specific transfer pattern 82a with respect to the specific transfer pattern 81a is rotated from the specified position 83a of the specific transfer pattern 82a in the clockwise direction. In other words, the relative position A between the specific transfer pattern 81a and the specific transfer pattern 82a is rotated from the relative position B between the specific transfer pattern 81a and the position 83a in the clockwise direction. When the specific transfer pattern determining unit 22 determines the transfer pattern 92 shown in FIG. 8A, the error calculating unit 23 recognizes that there is a rotation error and calculates the direction and the amount of rotation error, thereby calculating the error between the actual transfer pattern 92 and the specified transfer pattern 91. The transfer pattern 92 that is actually obtained by exposure may be rotated from the specified transfer pattern 91 in the counterclockwise direction.

Next, the orthogonality error is described with reference to FIGS. 8C and 8D; for example, it is assumed that, when the original (specified) transfer pattern is a transfer pattern 91 shown in FIG. 8C, a transfer pattern 92 is actually transferred by exposure. In this case, the position of the upper side of the specified transfer pattern 91 with a rectangular shape deviates in the right direction, and the actual transfer pattern 92 with a parallelogram shape is obtained. In this case, as shown in FIG. 8D, for example, the position of the specific transfer pattern 82a with respect to the specific transfer pattern 81a deviates from the specified position 83a of the specific transfer pattern 82a in the X direction. In other words, the relative position A between the specific transfer pattern 81a and the specific transfer pattern 82a deviates from the relative position B between the specific transfer pattern 81a and the position 83a in the X direction and is extended in the X-Y plane. When the specific transfer pattern determining unit 22 determines the transfer pattern 92 shown in FIG. 8C, the error calculating unit 23 recognizes that there is an orthogonality error and calculates the aspect (the position where the deviation occurs, the direction of the deviation, and the amount of deviation) of the orthogonality error, thereby calculating the error between the actual transfer pattern 92 and the specified transfer pattern 91. The transfer pattern 92 that is actually formed by exposure may be a pattern in which the upper side of the transfer pattern 91 deviates in the left direction, a pattern in which the left side or the right side of the transfer pattern 91 deviates in the upper direction or the lower direction, or a pattern in which the lower side of the transfer pattern 91 deviates in the right direction or the lower direction.

The alignment mark transfer pattern determining unit 25 determines the alignment mark transfer patterns 100 (FIG. 5), which are transfer patterns of the alignment marks 11 projected through the reticle 3, on the basis of the detection result (the light intensity distributions 81 and 82) of the light intensity distribution detecting sensor 7. As shown in FIG. 5, the alignment marks 11 are formed such that the alignment mark transfer pattern 100 has a characteristic shape that does not appear in the transfer of the internal pattern. Therefore, the alignment mark transfer pattern determining unit 25 can easily recognize the alignment mark transfer patterns 100 and determine the positions thereof.

The alignment mark position error calculating unit 26 calculates the remaining two error components among the six error components. Two error components calculated by the alignment mark position error calculating unit 26 is described with reference to FIGS. 6A and 6B as follows; for simplicity of description, it is assumed that the transfer pattern has a simple rectangular shape. For example, it is assumed that, when the original (specified) alignment mark transfer pattern 100 is a transfer pattern 101 shown in FIG. 6A, the light intensity distribution detecting sensor 7 detects the light intensity distribution of a transfer pattern 102 shown in FIG. 6A. In this case, the detected transfer pattern 102 deviates from the specified transfer pattern 101 in the right direction (X direction) of the FIG. 6A. When the alignment mark transfer pattern determining unit 25 determines the transfer pattern 102 shown in FIG. 6A, the alignment mark position error calculating unit 26 recognizes that there is a position error in the X direction and calculates the amount of position error, thereby calculating the error between the position of the transfer pattern 102 and the specified position of the transfer pattern 102 (the position of the transfer pattern 101). Similarly, for example, it is assumed that, when the original (specified) alignment mark transfer pattern is the transfer pattern 101 shown in FIG. 6B, the light intensity distribution detecting sensor 7 detects the light intensity distribution of the transfer pattern 102 shown in FIG. 6B. In this case, the detected transfer pattern 102 deviates from the specified transfer pattern 101 in the upward direction (Y direction) of the FIG. 6B. When the alignment mark transfer pattern determining unit 25 determines the transfer pattern 102 shown in FIG. 6B, the alignment mark position error calculating unit 26 recognizes that there is a position error in the Y direction and calculates the amount of position error, thereby calculating the relative error between the position of the transfer pattern 102 and the specified position of the transfer pattern (the position of the transfer pattern 101).

The control unit 20 stores data of the specified position of each alignment mark transfer pattern 100 in the reference coordinate system of the exposure device 1 in advance. The alignment mark position error calculating unit 26 compares the data of the specified position with the position of the detected alignment mark transfer pattern 100 in the reference coordinate system and calculates the position error of the alignment mark transfer pattern 100. As such, the alignment mark position error calculating unit 26 calculates the error between the position of each alignment mark transfer pattern 100 determined by the alignment mark transfer pattern determining unit 25 and the specified position of each alignment mark transfer pattern 100 in the X direction and the Y direction.

The correction parameter calculating unit 24 calculates alignment mark correction parameters for correcting the alignment mark transfer patterns 100 to the specified positions on the basis of the error calculated by the alignment mark position error calculating unit 26.

The correction parameter calculating unit 24 calculates correction parameters for correcting the transfer patterns on the basis of the error calculated by the error calculating unit 23.

It is possible to correct the position error in the X direction by correcting the relative position between the reticle stage 4 and the wafer stage 6 in the X direction. Similarly, it is possible to correct the position error in the Y direction by correcting the relative position between the reticle stage 4 and the wafer stage 6 in the Y direction. However, in general, the amount of relative movement between the reticle stage 4 and the wafer stage 6 required to correct the position errors is different from the position error of the alignment mark transfer pattern 100, according to, for example, the magnification of the exposure lens 5. Therefore, the correction parameter calculating unit 24 stores a relational expression for calculating the amount of relative movement between the reticle stage 4 and the wafer stage 6 according to the amount of position error of the alignment mark transfer pattern 100, and uses the relational expression to calculate the amount of relative movement between the reticle stage 4 and the wafer stage 6 required for correction as the alignment mark correction parameter. Specifically, for example, the correction of the position errors in the X direction and the Y direction using the alignment marks 11 is performed by moving the reticle stage 4. Therefore, the amount of movement of the reticle stage 4 is calculated as the alignment mark correction parameter.

It is possible to correct the magnification error in the X direction by correcting the relative position between the reticle stage 4 and the wafer stage 6 in the X direction for each exposure shot. Similarly, it is possible to correct the position error in the Y direction by correcting the relative position between the reticle stage 4 and the wafer stage 6 in the Y direction for each exposure shot. Therefore, the correction parameter calculating unit 24 can calculate the amount of relative movement between the reticle stage 4 and the wafer stage 6 required to correct the position error in each exposure shot as one of the correction parameters according to the magnification error of the transfer pattern. The position error for each exposure shot is corrected by, for example, moving the wafer stage 6. Therefore, the amount of movement of the wafer stage 6 is calculated as one of the correction parameters. However, when the magnification errors in the X direction and the Y direction are equal to each other, it is possible to correct the magnification error by correcting the magnification of the exposure lens 5. When the magnification errors in the X direction and the Y direction are equal to each other, the correction parameter calculating unit 24 calculates the amount of movement of the moving lens in the Z direction which is required for correction as one of the correction parameters.

For example, it is possible to correct the rotation error by correcting the rotation phase of the reticle stage 4 in the X-Y plane. Therefore, the correction parameter calculating unit 24 calculates the rotation direction and the amount of movement (rotation angle) of the reticle stage 4, which are required to correct the rotation error, as one of the correction parameters according to the direction and amount of rotation error of the transfer pattern.

It is possible to correct the orthogonality error by correcting the relative position between the reticle stage 4 and the wafer stage 6 in the X direction and the Y direction for each exposure shot. Therefore, the correction parameter calculating unit 24 calculates the amount of relative movement between the reticle stage 4 and the wafer stage 6, which is require to correct the position error for each exposure shot, as one of the correction parameters according to the orthogonality error of the transfer pattern. In addition, for example, the position error for each exposure shot is corrected by moving the wafer stage 6. Therefore, the amount of movement of the wafer stage 6 is calculated as one of the correction parameters.

The exposure control unit 27 uses the alignment mark correction parameter calculated by the correction parameter calculating unit 24 to correct the relative position between the reticle stage 4 and the wafer stage 6 such that the alignment mark transfer pattern 100 is disposed at a specified position.

The exposure control unit 27 uses the correction parameters calculated by the correction parameter calculating unit 24 to correct the exposure conditions such that the transfer pattern is arranged at a specified position. That is, the exposure control unit 27 appropriately performs the correction of the relative position between the reticle stage 4 and the wafer stage 6 in the X direction and the Y direction for each exposure shot, the correction of the position of the moving lens in the Z direction, and the correction of the rotation phase of the reticle stage 4 in the X-Y plane.

The control unit 20 includes, for example, a CPU (Central Processing Unit), a ROM (Read Only Memory) that stores, for example, a program for operating the CPU, and a RAM (Random Access Memory) that functions as a work area of the CPU. The CPU is operated by the operation program stored in the ROM to function as such the light intensity distribution acquiring unit 21, the specific transfer pattern determining unit 22, the error calculating unit 23, the correction parameter calculating unit 24, the alignment mark transfer pattern determining unit 25, the alignment mark position error calculating unit 26, the exposure control unit 27, the reticle stage movement control unit 31, the wafer stage movement control unit 32, and the lens movement control unit 33.

A method for manufacturing a semiconductor device according to the embodiment is described with reference to FIG. 9 as follows; a portion of the method for manufacturing the semiconductor device according to the embodiment forms an exposure method according to the embodiment.

First, the reticle 3 is transported and placed on the reticle stage 4 by a reticle transport arm (not shown). In this operation, the reticle 3 is placed on the reticle stage 4 with position accuracy corresponding to the operation accuracy of the reticle transport arm (Step S1).

Then, the reticle 3 is aligned using the alignment marks 11 (Step S2).

In the alignment of the reticle 3 using the alignment marks 11, first, the light intensity distribution acquiring unit 21 acquires the light intensity distribution of the transfer pattern (alignment mark transfer pattern 100 (FIG. 5)) of each of the alignment marks 11. The control unit 20 stores the specified value of the transfer position of the transfer pattern (alignment mark transfer pattern 100) of each alignment mark 11 as data in advance. The wafer stage movement control unit 32 moves the wafer stage 6 under the control of the light intensity distribution acquiring unit 21, thereby moving the light intensity distribution detecting sensor 7 to the specified transfer position of the alignment mark transfer pattern 100 corresponding to one alignment mark 11. Then, at that position, the exposure control unit 27 controls the light source 2 to emit light under the control of the light intensity distribution acquiring unit 21. When light is emitted, the light intensity distribution detecting sensor 7 detects the light intensity distribution of the alignment mark transfer pattern 100. Next, similarly, the light intensity distribution detecting sensor 7 is sequentially moved to the transfer positions of the alignment mark transfer patterns 100 corresponding to other alignment marks 11, and the light source 2 emits light at each of the transfer positions. Then, the light intensity distribution detecting sensor 7 detects the light intensity distribution of each of the alignment mark transfer patterns 100. In addition, the light intensity distribution detecting sensor 7 outputs the sequentially detected light intensity distributions to the control unit 20. The light intensity distribution acquiring unit 21 acquires the light intensity distributions output from the light intensity distribution detecting sensor 7. In this way, the light intensity distribution acquiring unit 21 can acquire the light intensity distribution of each alignment mark transfer pattern 100. In addition, the light intensity distribution acquiring unit 21 stores the data of the light intensity distribution of each alignment mark transfer pattern 100 and the movement direction and the amount of movement of the wafer stage 6 when the data of each light intensity distribution is acquired so as to be associated with each other.

Then, the alignment mark transfer pattern determining unit 25 determines the position of each alignment mark transfer pattern 100 on the basis of the light intensity distributions acquired by the light intensity distribution acquiring unit 21 and the movement direction and the amount of movement of the wafer stage 6 when the data of each light intensity distribution is acquired. Then, the alignment mark position error calculating unit 26 calculates the error between the positions of the alignment mark transfer patterns 100 in the X direction and the Y direction on the basis of the position of each alignment mark transfer pattern 100 determined by the alignment mark transfer pattern determining unit 25. Then, the correction parameter calculating unit 24 calculates the alignment mark correction parameters on the basis of the error calculated by the alignment mark position error calculating unit 26. Then, the exposure control unit 27 corrects the position of the reticle stage 4 using the alignment mark correction parameters calculated by the correction parameter calculating unit 24. As such, it is possible to correct the reference position of the reticle stage 4 in the reference coordinate system using the alignment marks 11.

Then, a correction process based on the transfer patterns of the unit patterns 13 included in the internal pattern 12 is performed before a series of exposure operations is performed on one wafer, or for each exposure shot in a series of exposure operations performed on one wafer.

In the correction process, first, the light intensity distribution acquiring unit 21 acquires the light intensity distributions 81 and 82 (FIG. 4) of the transfer patterns including the specific transfer pattern 81a and 82a (FIG. 4, FIGS. 7A to 7D, and FIGS. 8A to 8D), which are the transfer patterns of predetermined portions of two or more unit patterns 13 (Step S3).

The specific transfer patterns 81a and 82a to be acquired are two-dimensionally extended. The sizes of the specific transfer pattern 81a and 82a to be acquired are appropriately selected according to the detection range and the resolution of the light intensity distribution detecting sensor 7. The light intensity distribution detecting sensor 7 needs to acquire the specific transfer patterns 81a and 82a at positions other than a pattern transfer position where no light intensity distribution is formed in the detection range of the light intensity distribution detecting sensor 7. Patterns that allow an intensity distribution unique to the detection range of the light intensity distribution detecting sensor 7 to appear are selected as the specific transfer patterns 81a and 82a in advance. However, the patterns that allow the same intensity distribution to appear in the X direction and the Y direction are not preferable as the specific transfer patterns 81a and 82a. The patterns that allow different intensity distributions to appear in the X direction and the Y direction are selected as the specific transfer patterns 81a and 82a in advance. Specifically, for example, when the unit patterns 13 having memory cell portions are transferred, it is preferable to select the patterns of the memory cell portions as the specific transfer patterns 81a and 82a.

For example, the predetermined portion of the unit pattern 13 is one arbitrary portion or a plurality of arbitrary portions of the unit pattern 13. FIG. 4 shows an example in which the predetermined portion of the unit pattern 13 is one arbitrary portion. The control unit 20 stores the data of the positions of the transfer patterns of two or more unit patterns 13 from which the light intensity distributions 81 and 82 are acquired in one shot (one exposure range), the data of the positions of the specific transfer patterns 81a and 82a among the transfer patterns of the unit patterns 13, and the data of the specified gap between the transfer patterns of two or more unit patterns 13 (that is, the specified gap between the specific transfer patterns 81a and 82a) in advance. Then, the wafer stage movement control unit 32 moves the wafer stage 6 under the control of the light intensity distribution acquiring unit 21, thereby sequentially moving the light intensity distribution detecting sensor 7 to the vicinities of the transfer positions of the specific transfer patterns 81a and 82a corresponding to two or more unit patterns 13. This movement is performed according to the data of the transfer patterns of two or more unit patterns 13 from which the light intensity distributions 81 and 82 are acquired in the exposure shot and the data of the positions of the specific transfer patterns 81a and 82a among the transfer patterns of the unit patterns 13. At each of the positions, the exposure control unit 27 controls the light source 2 to emit light under the control of the light intensity distribution acquiring unit 21. When light is emitted, the light intensity distribution detecting sensor 7 detects the light intensity distributions 81 and 82 of the transfer patterns including the specific transfer patterns 81a and 82a which correspond to each unit pattern 13. The number of light intensity distribution detecting operations corresponds to the number of designated unit patterns within the range exposed by one exposure shot. When the detecting operation is performed, focus is adjusted, if necessary. The light intensity distribution detecting sensor 7 outputs the sequentially detected light intensity distributions 81 and 82 to the control unit 20. The light intensity distribution acquiring unit 21 acquires the light intensity distributions 81 and 82 output from the light intensity distribution detecting sensor 7. In this way, the light intensity distribution acquiring unit 21 can acquire the light intensity distributions 81 and 82 of the transfer patterns including the specific transfer patterns 81a and 82a corresponding to two or more unit patterns 13. The light intensity distribution acquiring unit 21 stores the data of each of the light intensity distributions 81 and 82 and the movement direction and the amount of movement of the wafer stage 6 when the data of the light intensity distributions 81 and 82 is respectively acquired.

Then, the specific transfer pattern determining unit 22 determines the specific transfer patterns 81a and 82a corresponding to two or more unit patterns 13 on the basis of the light intensity distributions of the specific transfer patterns acquired by the light intensity distribution acquiring unit 21. In the determination, for example, first, a position indicating the light intensity distribution of the specific transfer pattern 81a is extracted from the data of a first light intensity distribution, on the basis of the data of the position of the specific transfer pattern 81a among the transfer patterns of the unit patterns 13. Then, the same light intensity distribution as the data in the position of the specific transfer pattern 81a extracted from the data of the first light intensity distribution is searched and extracted from the data of a second light intensity distribution. That is, for example, the specific transfer pattern 82a shown in FIG. 4 is searched and extracted. Then, similarly, specific transfer patterns are searched and extracted from the remaining acquired light intensity distributions. In this way, it is possible to extract a specific transfer pattern (a light intensity distribution corresponding to the specific transfer pattern) from each of the acquired light intensity distributions.

Then, the error calculating unit 23 calculates the relative position A (FIG. 4) between the specific transfer patterns 81a and 82a determined (extracted) by the specific transfer pattern determining unit 22. For example, the relative position A is calculated on the basis of the difference between the position of the specific transfer pattern 81a in the light intensity distribution 81 and the position of the specific transfer pattern 82a in the light intensity distribution 82 and the difference between the position of the wafer stage 6 when the data of the light intensity distribution 81 is acquired and the position of the wafer stage 6 when the data of the light intensity distribution 82 is acquired. In addition, the error calculating unit 23 calculates the relative error between the arrangement of the transfer patterns of the internal pattern 12 and the specified arrangement of the transfer patterns of the internal pattern 12 on the basis of the comparison between the calculated relative position A and the specified value B (the value that is known from the set value of the pitch between the unit patterns 13 and is stored in the control unit 20 in advance) of the relative position. That is, the error calculating unit 23 calculates the above-mentioned four error components (the magnification error in the X direction, the magnification error in the Y direction, the rotation error in the X-Y plane, and the orthogonality error).

The correction parameter calculating unit 24 calculates correction parameters for correcting the transfer patterns to specified arrangement on the basis of the errors calculated by the error calculating unit 23 in the above-mentioned way (Step S4). The correction parameters include, for example, a parameter for correcting rotation which is performed before a series of exposure operations, a parameter for correcting the position of the moving lens which is moved to correct the magnification of the exposure lens 5 before a series of exposure operation, and a parameter for correcting the position of the wafer stage 6 for each exposure shot.

The exposure control unit 27 uses the correction parameters calculated by the correction parameter calculating unit 24 to correct the exposure conditions such that the actual transfer patterns are close to the specified transfer patterns (Step S5).

That is, where there is a rotation error, a control process of correcting the rotation phase of the reticle stage 4 in the X-Y plane using the parameter for correcting rotation is performed before a series of exposure operations. When it is necessary to correct the magnification of the exposure lens 5 (when the magnification errors in the X direction and the Y direction are equal to each other), a control of correcting the position of the moving lens in the Z direction using the parameter for correcting the position of the moving lens is performed before a series of exposure operations.

Then, a wafer having a resist applied thereon is transported and placed on the wafer stage 6 by the wafer transport arm (Step S6).

Then, the wafer stage movement control unit 32 sequentially moves the wafer stage 6 to predetermined positions under the control of the exposure control unit 27. In this way, the exposure shot on the wafer is taken at each movement position while moving the wafer on the wafer stage 6. When it is necessary to correct the position of the wafer stage 6 for each exposure shot (when the magnification errors in the X direction and the Y direction are different from each other or when there is an orthogonality error), the exposure control unit 27 corrects the position of the wafer stage 6 for each exposure shot using the parameter for correcting the position of the wafer stage 6 for each exposure shot (Step S7).

In this way, the exposure conditions are corrected. Therefore, it is possible to project the transfer patterns to predetermined positions on the wafer and perform exposure with high accuracy.

The position of the specific transfer pattern in the unit pattern 13 is known, but it is difficult to know from which of the pattern of the internal pattern 12 of the reticle 3 the projection image is generated in advance. Therefore, it is difficult to know the shape of the specific transfer pattern in advance. Thus, it is difficult to calculate the positional information of the reticle 3 in the reference coordinate system from the light intensity distributions of the specific transfer patterns, and it is difficult to correct the position of the reticle 3 in the reference coordinate system. Therefore, in this embodiment, the position of the reticle 3 in the reference coordinate system is corrected using the alignment marks 11, and then the exposure conditions are corrected on the basis of the relative position between the specific transfer patterns.

When the exposure of the wafer is completed, the exposed wafer is taken out from the wafer stage 6 by the wafer transport arm (Step S8).

Then, the same processes as those performed on the first wafer are sequentially performed on the second or more wafers (Steps S6 to S8 are repeatedly performed). In this way, the exposure process can be sequentially performed on a plurality of wafers.

An example of a detailed correction operation is described as follows; for example, as shown in FIG. 3, it is assumed that 4×4 (=16) unit patterns 13 are arranged in a matrix in the internal pattern 12 and the size of each unit pattern 13 is 1 cm by 1 cm. In this case, the sixteen unit patterns 13 are transferred onto the wafer by one exposure shot. For example, it is assumed that the light intensity distribution of the specific transfer pattern of each of the lower left unit pattern 13, the lower right unit pattern 13, and the upper left unit pattern 13 in FIG. 3 is acquired. It is assumed that the light intensity distribution of the transfer pattern including the specific transfer pattern of the lower left unit pattern 13 is detected at the beginning, and the wafer stage 6 is moved to sequentially detect the light intensity distribution of the transfer pattern of the lower right unit pattern 13 at the same position and the light intensity distribution of the transfer pattern of the upper left unit pattern 13 at the same position. In this case, for example, when the magnification of the exposure lens 5 is ¼, the wafer stage 6 is moved 1 cm (1×4÷4) in the X direction for the time from the detection of the light intensity distribution of the lower left unit pattern 13 to the detection of the light intensity distribution of the lower right unit pattern 13, and the wafer stage 6 is moved 1 cm (1×4÷4) in the Y direction for the time from the detection of the light intensity distribution of the lower left unit pattern 13 to the detection of the light intensity distribution of the upper left unit pattern 13. When the lower left unit pattern 13 is a reference point, the lower right unit pattern 13 is shifted +5 nm from an assumed position in the X direction and is shifted 0 nm from the assumed position in the Y direction, and the upper left unit pattern 13 is shifted 0 nm from an assumed position in the X direction and is shifted +10 nm from the assumed position in the Y direction. In this case, the magnification error in the X direction is $5/(10\times10^{-6})=0.5$ ppm, the magnification error in the Y direction is $10/(10\times10^{-6})=1.0$ ppm, and each of a rotation component and an orthogonal component is 0 μrad. The calculated magnification errors in the X direction and the Y direction are corrected during exposure. In this example, since the magnification errors in the X direction and the Y direction are different from each other, it is difficult to respond to the correction of the magnification of the exposure lens 5. For example, the position of the wafer stage 6 is corrected for each exposure shot to correct the magnification errors.

According to the above-described embodiment, the specific transfer patterns 81a and 82a, which are the transfer patterns of predetermined portions of the unit pattern 13 among the transfer patterns projected through the reticle 3, are determined for two or more unit patterns 13 on the basis of the detection result of the light intensity distribution detecting sensor 7. Then, the error between the transfer pattern and the specified transfer pattern is calculated on the basis of the comparison between the relative position A between the determined specific transfer patterns 81a and 82a and the specified value B of the relative position between the specific transfer patterns 81a and 82a. The correction parameters for correcting the transfer patterns are calculated on the basis of the calculated error, and the exposure conditions are corrected using the correction parameters such that the transfer patterns are corrected. That is, the exposure conditions are corrected on the basis of the errors of the transfer patterns of the unit patterns 13 included in the internal pattern 12. Therefore, it is possible to correct the transfer pattern with high accuracy, as compared to when the transfer pattern is corrected only by using the alignment marks 11. In addition, information of the approximate positions of the specific transfer patterns 81a and 82a and information of the specified value B of the relative position A between the specific transfer patterns 81a and 82a may be given to the exposure device 1 in advance. Therefore, it is possible to correct the transfer pattern easier than the technique that performs the simulation. In addition, in some cases, the accuracy of correction deteriorates due to the accuracy of simulation. Therefore, it is possible to correct the transfer pattern with high accuracy, as compared to the technique that performs the simulation. In short, it is possible to correct the transfer pattern during exposure with sufficient accuracy using a simple method.

The exposure device 1 includes the light intensity distribution detecting sensor 7 that detects the intensity distribution of light at multiple gray levels using the light intensity distribution detecting sensor. Therefore, even when the resolution of the pattern included in the unit pattern 13 is higher than the detection resolution (the density of pixels) of the light intensity distribution detecting sensor 7, it is possible to detect a specific part of the pattern (that is, the specific transfer patterns 81a and 82a). Therefore, it is possible to preferably provide the detection result to the determination of the specific transfer patterns 81a and 82a.

The light intensity distribution detecting sensor 7 is provided on the wafer stage 6 so as to be moved with the movement of the wafer stage 6. The specific transfer pattern determining unit 22 determines the specific transfer patterns 81a and 82a on the basis of the light intensity distribution detected by the light intensity distribution detecting sensor 7, with the light intensity distribution detecting sensor 7 moved to each of the projection positions of predetermined portions of two or more unit patterns 13, and the error calculating unit 23 calculates the error on the basis of the movement direction and the amount of movement of the wafer stage 6 when the light intensity distribution used to determine each of the specific transfer patterns 81a and 82a is detected and the detection result of the light intensity distribution by the light intensity distribution detecting sensor 7. Therefore, the light intensity distribution detecting sensor 7 does not need to detect the entire exposure range at once, but may have a local detection range.

The alignment marks 11 are formed at the edge of the reticle 3. The exposure device 1 includes the alignment mark transfer pattern determining unit 25 that determines the alignment mark transfer patterns 100, which are the transfer patterns of the alignment marks 11 projected through the reticle 3, on the basis of the detection result of the light intensity distribution detecting sensor 7 and the alignment mark position error calculating unit 26 that calculates the error between the position of the alignment mark transfer pattern 100 determined by the alignment mark transfer pattern determining unit 25 and the specified position of the alignment mark transfer pattern 100. The correction parameter calculating unit 24 calculates the alignment mark correction parameters for correcting the position of the alignment mark transfer pattern 100 to a specified position on the basis of the error calculated by the alignment mark position error calculating unit 26. The exposure control unit 27 uses the alignment mark correction parameters to correct the relative position between the reticle 3 and the wafer such that the alignment mark transfer pattern 100 is disposed at the specified position. Therefore, it is possible to correct the position in the reference coordinate system of the exposure device 1 by also performing correction using the alignment marks 11.

In the embodiment, it is possible to perform correction with higher accuracy as the number of unit patterns 13 for detecting the light intensity distribution increases. For example, when only the correction of magnification is considered, it is possible to perform (n−1)-order correction (correction according to an (n−1)-order curve) in the structure in which n unit patterns 13 are arranged in the X direction and the light intensity distributions of all of the unit patterns 13 are detected.

In the above-described embodiment, only the correction of the magnification is described as the correction of the lens. However, the correction of aberration may be performed as the correction of the lens.

In the above-described embodiment, the error calculating unit 23 calculates the magnification error (the magnification errors in the X direction and the Y direction), the rotation error, and the orthogonality error. However, the error calculating unit 23 may calculate at least one of the errors.

It is apparent that the present invention is not limited tot the above embodiments, and may be modified and changed without departing from the scope and spirit of the invention.

What is claimed is:

1. A method for manufacturing a semiconductor device, comprising:
    detecting an intensity distribution of light projected through a photomask including an internal pattern which is projected to a portion of a semiconductor wafer to be exposed in which a resist pattern is formed by exposure and said internal pattern includes a plurality of unit patterns that are arranged at a predetermined interval and have a same shape;
    determining specific transfer patterns, which are transfer patterns of predetermined portions of said unit patterns, among transfer patterns that are projected through said photomask for two or more unit patterns on the basis of a detection result in said detecting of said intensity distribution of light;
    calculating an error between a transfer pattern of said transfer patterns and a specified transfer pattern on the basis of a comparison between a relative position between said specific transfer patterns determined in said determining of said specific transfer patterns and a specified value of said relative position;
    calculating correction parameters for correcting said transfer patterns on the basis of said error calculated in said calculating of said error;
    correcting exposure conditions using said correction parameters such that said transfer patterns are corrected; and
    exposing said semiconductor wafer through said photomask.

2. The method for manufacturing a semiconductor device according to claim 1, further comprising:
    determining alignment mark transfer patterns, which are transfer patterns of alignment marks that are formed at the edge of said photomask and are projected through said photomask, on the basis of said detection result of said intensity distribution of light projected through said photomask;
    calculating an error between a position of said alignment mark transfer pattern determined in said determining of said alignment mark transfer patterns and a specified position of said alignment mark transfer pattern;
    calculating alignment mark correction parameters for correcting said position of said alignment mark transfer pattern to said specified position, on the basis of said error calculated in said calculating of said error; and
    correcting a relative position of said photomask and said substrate such that said position of said alignment mark transfer pattern is corrected to said specified position, using said alignment mark correction parameters.

3. An exposure method, comprising:
    detecting an intensity distribution of light projected through a photomask including an internal pattern which is projected to a portion of a substrate to be exposed in which a resist pattern is formed by exposure and said internal pattern includes a plurality of unit patterns that are arranged at a predetermined interval and have a same shape;
    determining specific transfer patterns, which are transfer patterns of predetermined portions of said unit patterns, among transfer patterns that are projected through said photomask for two or more unit patterns on the basis of a detection result in said detecting of said intensity distribution of light;
    calculating an error between a transfer pattern of said transfer patterns and a specified transfer pattern on the basis of a comparison between a relative position between said specific transfer patterns determined in said determining of said specific transfer patterns and a specified value of said relative position;
    calculating correction parameters for correcting said transfer patterns on the basis of said error calculated in said calculating of said error;
    correcting exposure conditions using said correction parameters such that said transfer patterns are corrected; and
    exposing said substrate through said photomask.

* * * * *